United States Patent
Koike

(10) Patent No.: US 6,717,279 B2
(45) Date of Patent: Apr. 6, 2004

(54) SEMICONDUCTOR DEVICE WITH RECESSED PORTION IN THE MOLDING RESIN

(75) Inventor: Masahiro Koike, Tokyo (JP)

(73) Assignee: NEC Corporation, Tokyo (JP)

( * ) Notice: Subject to any disclaimer, the term of this patent is extended or adjusted under 35 U.S.C. 154(b) by 26 days.

(21) Appl. No.: 10/090,787

(22) Filed: Mar. 6, 2002

(65) Prior Publication Data

US 2002/0167093 A1 Nov. 14, 2002

(30) Foreign Application Priority Data

Mar. 6, 2001 (JP) .......................................... 2001-061800

(51) Int. Cl.$^7$ .............................................. H01L 23/48
(52) U.S. Cl. ...................... 257/787; 257/687; 257/778
(58) Field of Search .............................. 257/787, 687, 257/712, 706, 778, 730, 737; 438/108, 127

(56) References Cited

U.S. PATENT DOCUMENTS

| | | | | |
|---|---|---|---|---|
| 5,302,850 A | * | 4/1994 | Hara | 257/667 |
| 5,420,752 A | * | 5/1995 | Variot | 361/709 |
| 6,369,449 B2 | * | 4/2002 | Farquhar et al. | 257/778 |
| 6,525,421 B1 | * | 2/2003 | Chia et al. | 257/730 |
| 6,552,428 B1 | * | 4/2003 | Huang et al. | 257/706 |

FOREIGN PATENT DOCUMENTS

| | | |
|---|---|---|
| JP | 10-270477 | 10/1998 |
| JP | 2000-349203 | 12/2000 |

* cited by examiner

Primary Examiner—Evan Pert
Assistant Examiner—Lourdes Cruz
(74) Attorney, Agent, or Firm—Whitham, Curtis & Christofferson, P.C.

(57) ABSTRACT

A semiconductor device can perform resin sealing of an under-fill region and peripheral portion on the side of a semiconductor chip in the same process step, with shortening periods required for filling and curing the under-fill resin and avoiding formation of an internal void, and can simplify fabrication process and component parts. The semiconductor device includes a through opening provided at a predetermined position of the wired substrate, an under-fill region as a gap portion between the wired substrate and the semiconductor chip, and a molded resin portion as peripheral portion along side edge of the semiconductor chip. The molded resin portion and the through opening are sealed by resin, and a region where a distance between a connection surface with the semiconductor chip of the wired substrate and a resin surface of the molded resin portion is greater than a distance between the connection surface with the semiconductor chip of the wired electrode and a back surface of the semiconductor chip, being formed in the molded resin portion.

6 Claims, 13 Drawing Sheets

SEMICONDUCTOR DEVICE WITH RECESSED PORTION IN THE MOLDING RESIN

BACKGROUND OF THE INVENTION

1. Field of the Invention

The present invention relates to a circuit device having a structure, in which a semiconductor chip and an interposer substrate are integrally coupled by a flip chip connection, and a fabrication process of the circuit device.

2. Description of the Related Art

Currently, circuit devices, such as IC (Integrated Circuit) and so forth, have been fabricated as independent chip parts, and are used in various electronic equipments. Such circuit device has a structure, in which a large number of lead terminals are arranged on a circumference of a semiconductor chip of a semiconductor circuit having large number of connection pads, the lead terminals are individually connected with the connection pads of the semiconductor chip by bonding wire, and inside portions of the semiconductor chip and the lead terminals are sealingly embedded in resin member.

In the circuit device of the construction set forth above, since a large number of lead terminals are projected outside of an outer periphery portion of the resin member, data communication can be established between the printed circuit on a printed circuit board (PCB) and a semiconductor circuit of the circuit device by mounting the circuit device on an upper surface of the PCB and connecting the lead terminals with the printed circuit.

However, in the recent years, downsizing and increasing of integration degree of the circuit device is in progress to cause increasing of number and density of the lead terminals. This causes difficulty in accurately connecting the lead terminals of the circuit device to the printed circuit on the PCB at user level. Furthermore, fine lead terminals lack strength to easily cause breakage of the lead terminals in handling at user level to spoil the circuit device.

In order to solve the foregoing problem, a semiconductor package as the circuit device of BGA (Ball Grid Array) structure has been developed. In the semiconductor package of the BGA structure, connection terminals are formed as spherical solder bump, which are, arranged entire area of a lower surface of the device as two-dimensional array. Therefore, arrangement density of the lead terminals can be lowered and breakage of the lead terminals is hardly caused.

One example of the conventional circuit device of BGA structure will be discussed hereinafter with reference to FIG. 15. It should be noted that FIG. 15 is a diagrammatically illustrated section showing an internal structure of the semiconductor package as the circuit device. On the other hand, for simplification of disclosure, up and down direction on the drawing is expressed as up and down direction of the device, simply.

As shown in FIG. 15, the semiconductor package 1 exemplifying the circuit device has a semiconductor chip 2 consisted of a semiconductor circuit integrated at high density. The semiconductor chip 2 is mounted on the upper surface of the interposer substrate 3. The semiconductor chip 2 is formed with a large number of connection pads (not shown) on the lower surface. On the other hand, the interposer substrate 3 is formed with a large number of connection pads (not shown) on both of the upper surface and the lower surface.

In greater detail, the interposer substrate 3 is formed with a large number of connection pads at the center portion of the upper surface at positions corresponding to the connection pads of the semiconductor chip 2 at high density, and large number of connection pads is formed over substantially entire area at low density. Then, the interposer substrate 3 is formed into a multi-layer structure and large number of printed circuits and through holes is formed in the upper surface, the lower surface and inside. A large number of connection pads on the upper surface and the lower surface are appropriately connected through the printed circuits and the through holes.

On each of these connection pads, a solder bump 4 is mounted. The connection pad on the lower surface of the semiconductor chip 2 and the connection pad on the upper surface of the interposer substrate 3 are mechanically connected by a solder bump 4 for electrical connection. It should be noted that within intervals between the solder bumps 4, an under-fill resin 5 of epoxy resin is filled. By the under-fill resin 5, mechanical connection between the lower surface of the semiconductor chip 2 and the upper surface of the interposer substrate 3 is reinforced.

Furthermore, in the semiconductor package 1 exemplified herein, sidewall form metallic stiffener 6 is engaged on the outer peripheral portion of the upper surface of the interposer substrate 3. On the upper surfaces of the stiffener 6 and the semiconductor chip 2, a top plate form metallic heat spreader 7 is bonded by a metal paste 8.

In the semiconductor package 1 of the construction set forth above, the semiconductor circuit is integrated on the semiconductor chip 2 at high density, and the connection pads are arranged on the semiconductor chip 2 at high density. On large number of connection pads on the upper surface of the interposer substrate 3 of the same arrangement, solder bumps 4 are connected individually. A large number of connection pads on the upper surface of the interposer substrate 3 are appropriately connected to a large number of connection pads arranged on the lower surface thereof at low density.

The conventional fabrication process of the semiconductor package 1 of the structure set forth above will be discussed briefly. At first, as various parts forming the semiconductor package 1, the semiconductor chip 2, the interposer 3, the stiffener 6, the heat spreader 7 and so forth are fabricated with respectively predetermined structures.

Next, the stiffener 6 is bonded on the outer periphery portion on the upper surface of the interposer substrate 3, and the semiconductor chip 2 is bonded on the center portion by the solder bump 4 by bonding connection. Then, the entire interposer substrate 2 with the stiffener 6 and the semiconductor chip 2 is washed by flux washing and dried. Then, $O_2$ plasma process is performed. Within gaps between the interposer substrate 3 and the semiconductor chip 2, epoxy resin to be under-fill resin 5 is filled and cured to form the under-fill resin 5.

Then, the head spreader 7 is bonded on the upper surface of the semiconductor chip 2 by the metal paste 8 and also bonded on the stiffener 6 by an bonding agent 9, such as epoxy resin or the like. Finally, for each of large number of connection pads on the lower surface of the interposer substrate 3, the solder bumps 4 are loaded to complete the semiconductor package 1.

Upon fabrication of the semiconductor package 1 set forth above, the under-fill resin 5 is filled in order to improve mechanical connection strength of the semiconductor chip 2 and the interposer substrate 3. As a method of implantation of the under-fill resin 5, a liquid state resin is supplied from peripheral edge of the semiconductor chip by means of a dispensing nozzle mounting a syringes stocking the liquid state resin for making the high viscosity epoxy resin to penetrate into fine gaps between the semiconductor chip 2 and the interposer substrate by capillary phenomenon. However, long period is required for operation to make the liquid state resin to penetrate and a long required for curing the liquid state resin becomes longer than that of transfer molding using a tablet resin to degrade production efficiency. Furthermore, by penetration depending upon capillary phenomenon, internal void as a space not filled with the resin can be caused to make it difficult to enhance reliability of the package.

On the other hand, in the foregoing semiconductor package 1 is separately fabricated the interposer substrate 3 and the stiffener 6 and is then bonded. On the stiffener 6, the heat spreader 7 is bonded by epoxy resin. Therefore, number of process steps in fabrication and number of component parts are large to lower productivity. Also, since a plate form heat spreader 7 is bonded on the upper surface of the semiconductor chip 2 and the stiffener 6, it becomes necessary to adjust respect upper surfaces of the semiconductor chip 2 and the stiffener 6 in flush. This also servers for degrading productivity of the semiconductor package 1.

On the other hand, as a method for filling the under-fill resin, there has been disclosed in Japanese Unexamined Patent Publication No. Heisei 10-270477, a method, in which a through hole for filling resin is formed at a predetermined position of the circuit board and a resin is filled by applying a pressure on the resin with inserting the nozzle for supplying resin into the through hole. However, in order to bond the heat spreader on the upper surface of the semiconductor chip and the stiffener, large number of fabrication processes and component parts are required for lowering productivity.

Also, in Japanese Unexamined Patent Publication No. 2000-349203, there has been disclosed a fabrication process of a semiconductor device, in which the flip chip mounted semiconductor chip and the interposer are contacted with a cavity of a mold and a molten epoxy resin is filled from the side portion of the semiconductor chip under pressure. However, problems are encountered in that long period is required for filling the resin from the side portion of the semiconductor chip and in that sneaking of resin is caused since gap between the semiconductor chip and the interposer is narrow to cause internal void. Furthermore, due to breakage of the corner portion of the semiconductor chip by contact between the mold and the semiconductor chip or sneaking of resin to the back surface of the semiconductor chip by filling of the resin under pressure, degradation of external appearance can be caused.

SUMMARY OF THE INVENTION

The present invention has been worked out in view of the problems and drawbacks in the prior art as set forth above. Therefore, it is an object of the present invention to provide a resin sealing method and a resin sealing device of a semiconductor device which can perform resin sealing of an under-fill region and peripheral portion on the side of a semiconductor chip in the same process step, with shortening periods required for filling and curing the under-fill resin and avoiding formation of an internal void, and can simplify fabrication process and component parts.

In order to accomplish the above-mentioned object, according to the first aspect of the present invention, a semiconductor device, in which a semiconductor chip is connected to a wired substrate, comprises:

a through opening provided at a predetermined position of the wired substrate;

an under-fill region as a gap portion between the wired substrate and the semiconductor chip; and a molded resin portion as peripheral portion along side edge of the semiconductor chip;

the molded resin portion and the through opening being sealed by resin;

a region where a distance between a connection surface with the semiconductor chip of the wired substrate and a resin surface of the molded resin portion is greater than a distance between the connection surface with the semiconductor chip of the wired electrode and a back surface of the semiconductor chip, being formed in the molded resin portion.

Since the surface of the semiconductor chip is formed at lower position than the resin surface of the molded resin, it can successfully present contact between the heat spreader and the semiconductor chip which otherwise damage the semiconductor chip in the subsequent process. Also, since it becomes unnecessary to form stiffener, fabrication process and component parts can be simplified as compared with the prior art to permit lowering of production cost.

Also, for achieving the above-mentioned object, according to the second embodiment of the present invention, a semiconductor device, in which a semiconductor chip is connected to a wired substrate, comprises:

a through opening provided at a predetermined position of the wired substrate;

an under-fill region as a gap portion between the wired substrate and the semiconductor chip; and a molded resin portion as peripheral portion along side edge of the semiconductor chip;

the molded resin portion and the through opening being sealed by resin;

a stepped down portion as a recessed portion being formed surrounding the semiconductor chip in the molded resin portion as peripheral portion of the semiconductor chip.

By forming the stepped down portion in the molded resin portion, extra amount of metal paste and/or bonding agent to be used for securing the heat spreader on the semiconductor chip and/or the molded resin portion, can be captured to prevent occurrence of bonding failure.

In the preferred construction, the stepped down portion of the molded resin portion may have a tilted surface descending from an upper end surface of the semiconductor chip.

By providing the titled surface in the stepped down portion, it becomes possible to prevent penetration of the resin to the back surface of the semiconductor chip upon injection of the resin. Thus, failure by external appearance inspection can be reduced to improve yield of production.

Also, for achieving the foregoing object, it is preferred that the molded resin portion is formed with an over-hang portion overlapping with the upper end surface of the semiconductor device.

By forming the over-hang portion, the corner portions of the semiconductor chip can be protected by the resin to successfully prevent breakage of the semiconductor chip.

On the other hand, it is also possible for achieving the foregoing object that the molded resin portion is formed over substantially entire area of the wired substrate.

By forming the molded resin over substantially entire area, bowing of the semiconductor package in heat treatment in the subsequent process to improve reliability in mounting of the semiconductor package.

The resin may be injected through one or more through holes provided in the wired substrate for electrical connection under pressure for forming the under-fill region and the molded resin portion.

By using the through hole, it becomes unnecessary to form the through opening in the printed circuit board to contribute for down-sizing of the printed circuit board to contribute for reduction of weight and size of the semiconductor package.

For accomplishing the above-mentioned object, according to the third aspect of the present invention, a resin seal process of a semiconductor device for sealing an molding object, in which a semiconductor chip is connected with a wired substrate by a flip chip connection, by way of a transfer sealing method, comprises steps of:

setting the molding object within a mold;

clamping the mold;

injecting a resin into the resin flow passage provided in the mold for filling the resin through a through opening provided in the wired substrate from the resin flow passage for forming into a predetermined shape.

By making the resin flow passage provided in the mold corresponding to the semiconductor package, it becomes possible to fabricate variety of semiconductor packages with only exchanging the mold to simplify fabrication process. ON the other hand, in order to fill the resin from the through opening, it is possible to set the process for preferentially filling the resin of the under-fill region.

For accomplishing the above-mentioned object, it is preferred that filling of the resin is performed with varying injection amount of the resin per unit period according to elapsed time.

By varying the injection amount of the resin according to elapsed time, filing of the resin into particular portion of the semiconductor package can be assured. Resin sealing corresponding various kind of semiconductor packages can be performed.

For accomplishing the above-mentioned object, it is preferred that a plurality of the through openings and the resin flow passages are provided for performing filling of the resin at a plurality of portions.

By filing the resin from a plurality of positions, a period required for filing can be shortened by reducing production cost.

Preferably, filling of resin from the plurality of portions is performed with setting filling speed per route of the resin flow passages independently of each other.

By varying the filling speed per route of the resin flow passages, resin seal corresponding to the shape of the semiconductor package to be obtained can be performed to adapt for wide variety of products.

Preferably, filling of resin from a plurality of portions is performed with setting filling start timing per route of the resin flow passage independently of each other.

By varying filling start timing per route of the resin flow passages, resin seal corresponding to the shape of the semiconductor package to be obtained can be performed to adapt for wide variety of products.

For accomplishing the foregoing object, filling speed of resin into an under-fill region as a gap portion between the wired substrate and the semiconductor chip may be lower than a filling speed of the resin into a molded resin portion as peripheral portion of the semiconductor chip.

Since resin filling speed to the under-fill region can be higher than that of the mold resin portion, filing of the resin to the under-fill resin can be certainly performed to suppress formation of the internal void to improve reliability of the semiconductor package.

Preferably, filling timing of resin into an under-fill region as a gap portion between the wired substrate and the semiconductor chip may be earlier than a filing timing of the resin into a molded resin portion as peripheral portion of the semiconductor chip.

Filing of resin into the under-fill region can be done at early timing in comparison with filling in the mold resin portion for ensuring filing of the resin within the under-fill area to suppress formation of the internal void to improve reliability of the semiconductor package.

Preferably, filling of the resin is performed through one or more through holes provided in the wired substrate for electrical connection to make it equivalent to the through opening.

By utilizing the through hole, it becomes unnecessary to form the through opening in the wired substrate, downsizing of the wired substrate can be achieved to contribute for reduction of weight and size of the semiconductor package.

The resin seal process of a semiconductor device may further comprise step of setting a plurality of molding objects within the mold and clamping the mold for filing the resin for a plurality of semiconductor chips simultaneously.

Also, by filling the resin in a lump, number of semiconductor package to be fabricated within the unit period can be increased to contribute for lowering of production cost.

For accomplishing the above-mentioned object, according to the fourth aspect of the present invention, a resin sealing apparatus for resin sealing a molding object, in which a semiconductor chip is connected to the mold and a resin seal is formed in a shape of a cavity portion provided in the mold by a transfer seal method, comprises:

a resin flow passage formed as a space in the mold up to a position corresponding to a through opening provided in a wired substrate from a plunger introducing opening for performing injection of the resin into the mold.

In case of the mold exchangeable of the resin injection conduit and the runner, it is facilitated to exchange the resin flow passage to permit resin seal or encapsulation depending upon the shape of the semiconductor passage and thus to adapt for increased variety of the products.

Preferably, the resin flow passage is formed to a position corresponding to a through hole provided in the wired substrate for electrical connection.

By utilizing the through hole, it becomes unnecessary to form the through opening in the wired substrate to permit downsizing of the wired substrate to reduce weight and size of the semiconductor package.

The mold may be formed with a stepped down portion recessed with a tilted peripheral portion of the cavity portion in a region corresponding to the semiconductor chip.

By providing the stepped down portion, penetration of the resin to the back surface of the semiconductor chip can be prevented to contribute for improvement of yield in production.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure is not shown in detail in order to avoid unnecessary obscurity of the present invention.

First Embodiment

Figure 1:
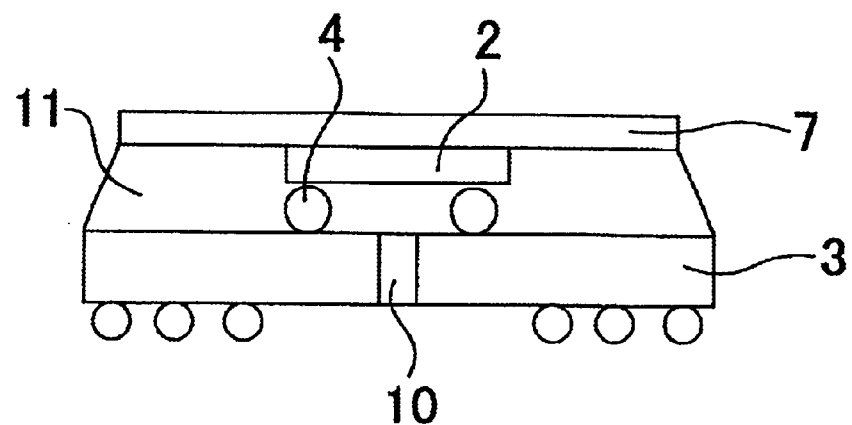
FIG. 1 is a diagrammatic longitudinal section showing an internal structure of a semiconductor package.

At first, the first embodiment of the present invention will be discussed hereinafter with reference to the drawings. FIG. 1 is a diagrammatic longitudinal section of an internal structure of the first embodiment of a semiconductor package according to the present invention.

A semiconductor package 1 with a BGA structure includes a semiconductor chip 2, in which semiconductor circuits are integrated at high density. The semiconductor chip 2 is mounted on an upper surface of an interposer substrate 3. The semiconductor chip 2 is formed with a plurality of connection pads (not shown) on the lower surface thereof. The interposer substrate 3 is formed with a plurality of connection pads (not shown) on the upper and lower surfaces thereof. On the other hand, at a position of the interposer substrate 3 in opposition to the semiconductor chip 2, a through hole 10 extending through the interposer substrate 3 is provided and opening to both of the upper and lower surfaces thereof is formed.

More particularly, the interposer substrate 3 is formed with a large number of connection pads on the center portion of the upper surface at positions respectively corresponding to the connection pads of the semiconductor chip 2 at high density. On the other hand, on the lower surface of the interposer substrate, a large number of connection pads are formed over substantially entire surface at low density. The interposer substrate 3 has a multi-layer structure. On an upper surface, a lower surface and inside, a large number of printed circuits and through holes are formed. Via these printed circuits and the through holes, large number of connection pads on the upper surface and the lower surface are appropriately connected.

On each connection pad, a solder bump 4 is provided. The connection pad on the lower surface of the semiconductor chip 2 and the connection pad on the upper surface of the interposer substrate 3 are mechanically connected and electrically connected. It should be noted that an under-fill region as a gap between the semiconductor chip 2 and the interposer substrate 3, a molded resin portion as peripheral region of the semiconductor chip 2, and the through hole 10 are filled with a molded resin 11 of biphenyl type resin formed by transfer seal. By the molded resin 11, mechanical connection between the lower surface of the semiconductor chip 2 and the upper surface of the interposer substrate 3 can be reinforced.

Furthermore, on the upper surface of the semiconductor chip 2, a top plate form metallic heat spreader 7 is bonded by a metal paste 8 or the like. Also, on the upper surface of the molded resin 11, the heat spreader 7 is bonded by a bonding agent of epoxy resin.

In the semiconductor package 1 of the construction set forth above, semiconductor circuits are integrated on the semiconductor chip 2 at high density. Also, connection pads are arranged at high density. It should be noted that a large number of connection pads of the semiconductor chip 2 arranged at high density are respectively connected to a large number of connection pads on the upper surface of the interposer 3 through the solder bumps 4. The large number of connection pads on the upper surface of the interposer substrate 3 are connected to a large number of connection pads arranged on the lower surface thereof at low density.

Figure 2:
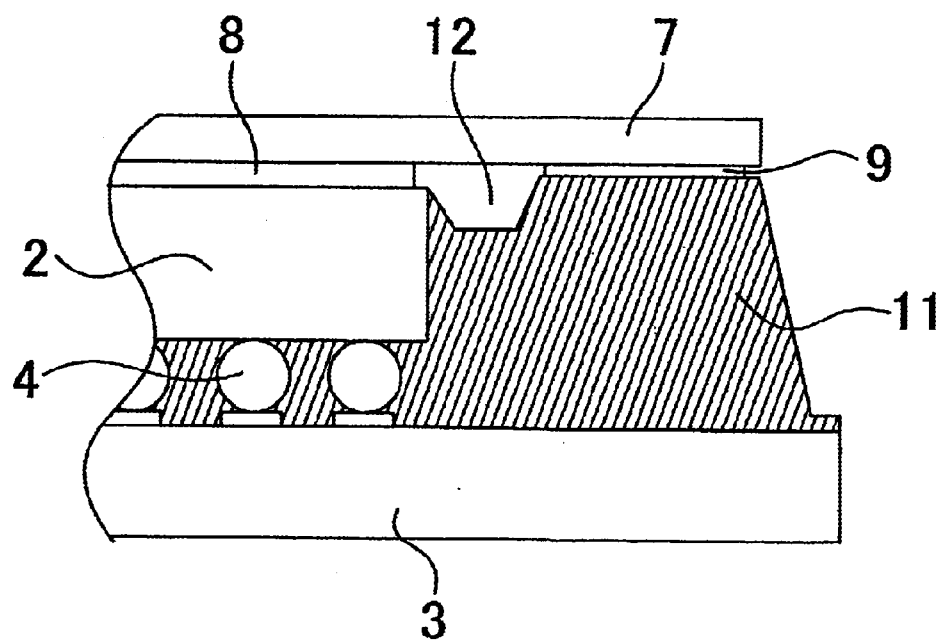
FIG. 2 is a partial enlarged view of the semiconductor package of FIG. 1.

FIG. 2 is a partial enlarged view of the semiconductor package 1 shown in FIG. 1. FIG. 2 diagrammatically shows a shape of the molded resin around a junction of the semiconductor chip 2, the heat spreader 7 and the molded resin 11.

A stepped down portion 12 as a recessed portion having a tilted surface descending from the upper peripheral edge of the semiconductor chip 2, is formed in the molded resin 11. On the other hand, at a higher position than the back surface of the semiconductor chip 2, an upper surface portion of the molded resin 11 is formed. Here, the back surface of the semiconductor chip 3 means the surface located at the upper side in the drawing and is referred to the surface on which the heat spreader 7 is bonded by metal paste 8.

By forming the stepped down portion 12 in the molded resin portion, when extra mount of the metal paste 8 used for connecting the semiconductor chip 2 and the heat spreader 7 or extra amount of the bonding agent 9 to be used for connection between the heat spreader 7 and the molded resin 11, runs off upon bonding the heat spreader 7, the running off metal paste or the bonding agent can be captured by the stepped down portion 12. By this, admixing of the metal paste 8 and the bonding agent on the back surface of the semiconductor chip 2 or on the upper surface of the molded resin can be prevented to enhance reliability of mechanical connection of the heat spreader 7.

On the other hand, by forming the back surface of the semiconductor chip 2 at higher position that the upper surface of the molded resin 11, contacting between the top plate type metallic heat spreader 7 and the semiconductor chip 2 can be prevented for avoiding breakage of the semiconductor chip 2 due to contact between the semiconductor chip 2 and the heat spreader 7. On the other hand, since it becomes unnecessary to form the stiffener employed conventionally, simplification of parts construction and simplification of the fabrication process can be achieved to shorten fabrication period and reduction of fabrication cost.

Figure 3:
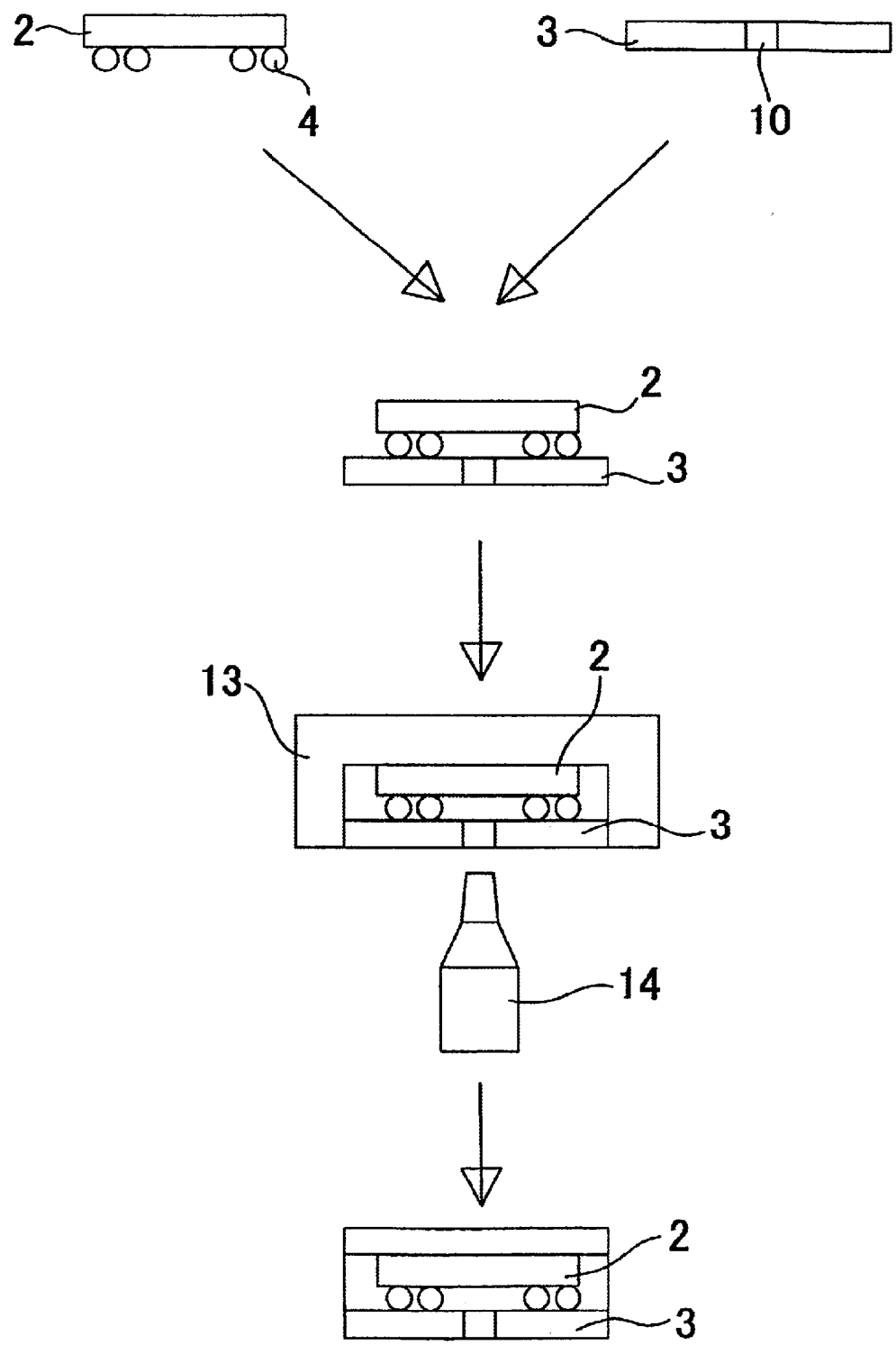
FIG. 3 is a process flow diagrammatically illustrating a fabrication process of the semiconductor package;]

Concerning the fabrication process of the first embodiment of the semiconductor package 1, discussion will be given with reference to FIGS. 3 to 6. FIG. 3 is a diagrammatic flow of process step of the fabrication process of the semiconductor package 1.

The through hole 10 is formed, and the interposer substrate 3, in which a plurality of printed circuits and through holes are formed on the upper and lower surfaces and within the multi-layer structure. On the other hand, the semiconductor chip 2 formed with the solder bumps 4 are separately prepared to establish flip chip connection between the semiconductor chip 2 and the interposer substrate 3. Subsequently, washing and drying of flux used for flip chip connection is performed, and then $O_2$ plasma washing is performed.

A sub-assembly of the semiconductor chip 2 and the interposer substrate 3 connected by flip chip connection is set in a mold 13 which is prepared preliminarily. Then, biphenyl resin is injected from a plunger 14 through the through hole 10 under pressure to fill to cure the biphenyl resin to form the molded resin 11 (transfer seal).

The semiconductor chip 2, the interposer substrate 3 as integrated by the molded resin 11 is removed from the mold 13 to apply the metal paste, such as silver paste or the like on the back surface of the semiconductor chip 2 and to apply the bonding agent, such as epoxy resin on the upper surface of the molded resin 11. Subsequently, the heat spreader 7 is contacted on the semiconductor chip 2 and the molded resin 11 for bonding.

Furthermore, by providing the solder bumps even on the interposer substrate 3, the semiconductor package is completed.

Figure 4:
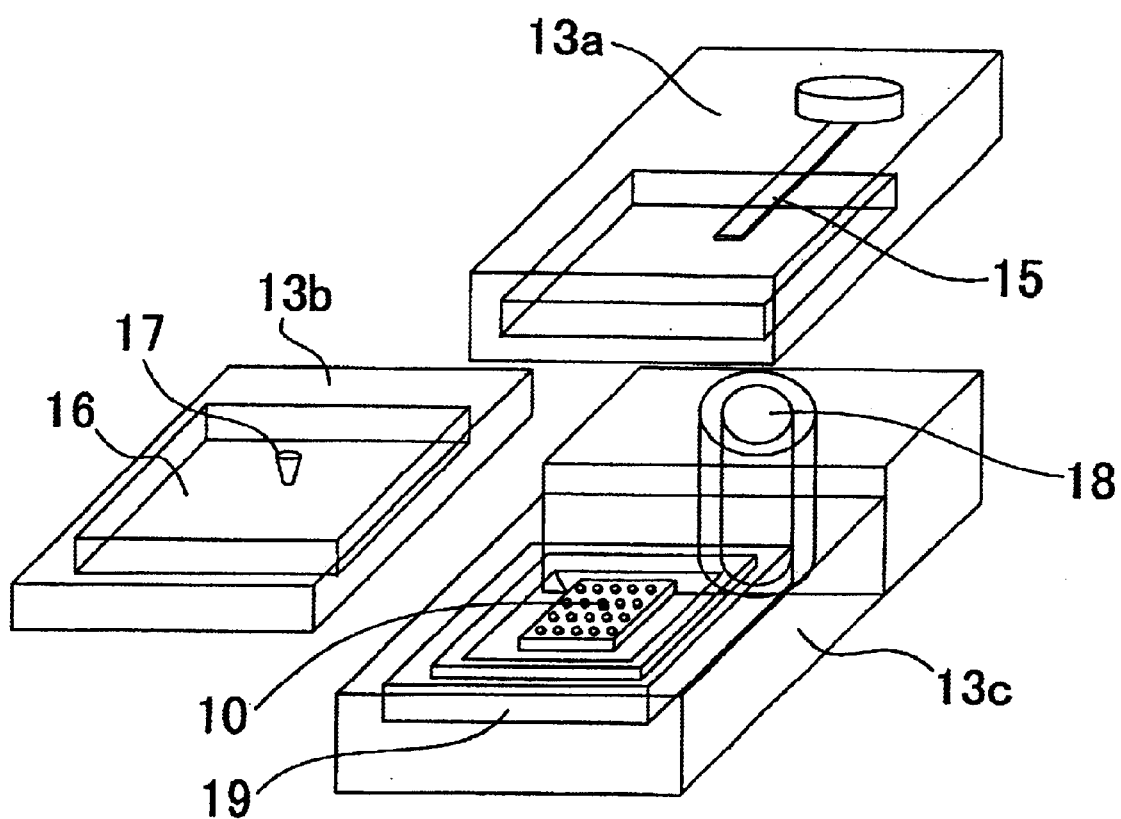
FIG. 4 is an illustration showing an example of sealing mold in the first embodiment of the present invention.
Figure 5:
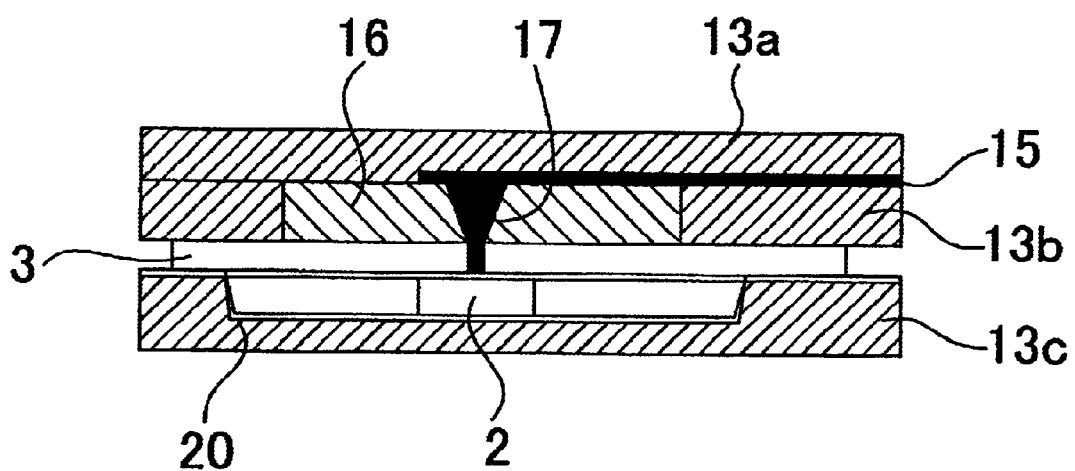
FIG. 5 is a sectional side elevation of a mold in the first embodiment of the present invention.

Concerning the foregoing transfer seal, detailed discussion will be given with reference to FIGS. 4 to 6. FIG. 4 is a diagrammatic illustration of one embodiment of the sealing mold in the case where the mold 13 is formed with an upper die 13a, an intermediate die 13b and a lower die 13c. FIG. 5 is a sectional side elevation of the mold in a condition where the mold is clamped with setting the package.

As a condition for transfer seal, filling of the biphenyl resin is performed in the following setting range.

| Mold Temperature | 170 to 180° C. |
| --- | --- |
| Injection Period | 10 to 20 Sec. |
| Injection Pressure | 80 to 100 kgf/cm$^2$ |
| Mold Clamping Pressure | 75 to 150 kgf/cm$^2$ |

The injection period was varied with the range set forth above depending upon resin characteristics and the injection pressure is also controlled in multiple stage speeds and multiple stage pressure with taking the resin characteristics and strength of the solder bumps into account. As an example, a mode, in which "up to a resin injection conduit 17, a feeding speed is high, and during filling in the gap between the semiconductor chip 2 and the interposer substrate 3, the feeding speed is low, and thereafter, the feeding speed is again high" can considered.

On the other hand, as biphenyl resin to be filled, a resin satisfying the following condition was used.

| Filler Content | 80% or more |
| --- | --- |
| Filler diameter | 54 μm or less |
| Minimum Molten Viscosity | 25 × 10$^2$ Nm or less |

Designing condition of the solder bumps provided in the gap between the semiconductor chip 2 and the interposer 3 was as follow.

| Bump Material | eutectic solder bump, lead free solder bump, gold bump |
| --- | --- |
| Bump Height | 20 to 150 μm |

In the upper die 13a, a runner 15 as a flow passage of molten biphenyl resin is formed. Biphenyl resin injected by the plunger 14 under pressure is supplied to the surface contacting with the intermediate die 13b.

In the intermediate die 13b, a gate plate 16 is provided detachably. In the gate plate 16, a resin injection conduit 17 as a conduit for injecting biphenyl resin to the lower die 13c is formed at a position corresponding to the runner 15.

In the lower die 13c, a plunger introducing opening 18 for injecting biphenyl resin into the runner 15 by inserting the plunger 14, and a cavity portion 19 for forming the molded resin 11 into objected shape are formed.

Figure 6:
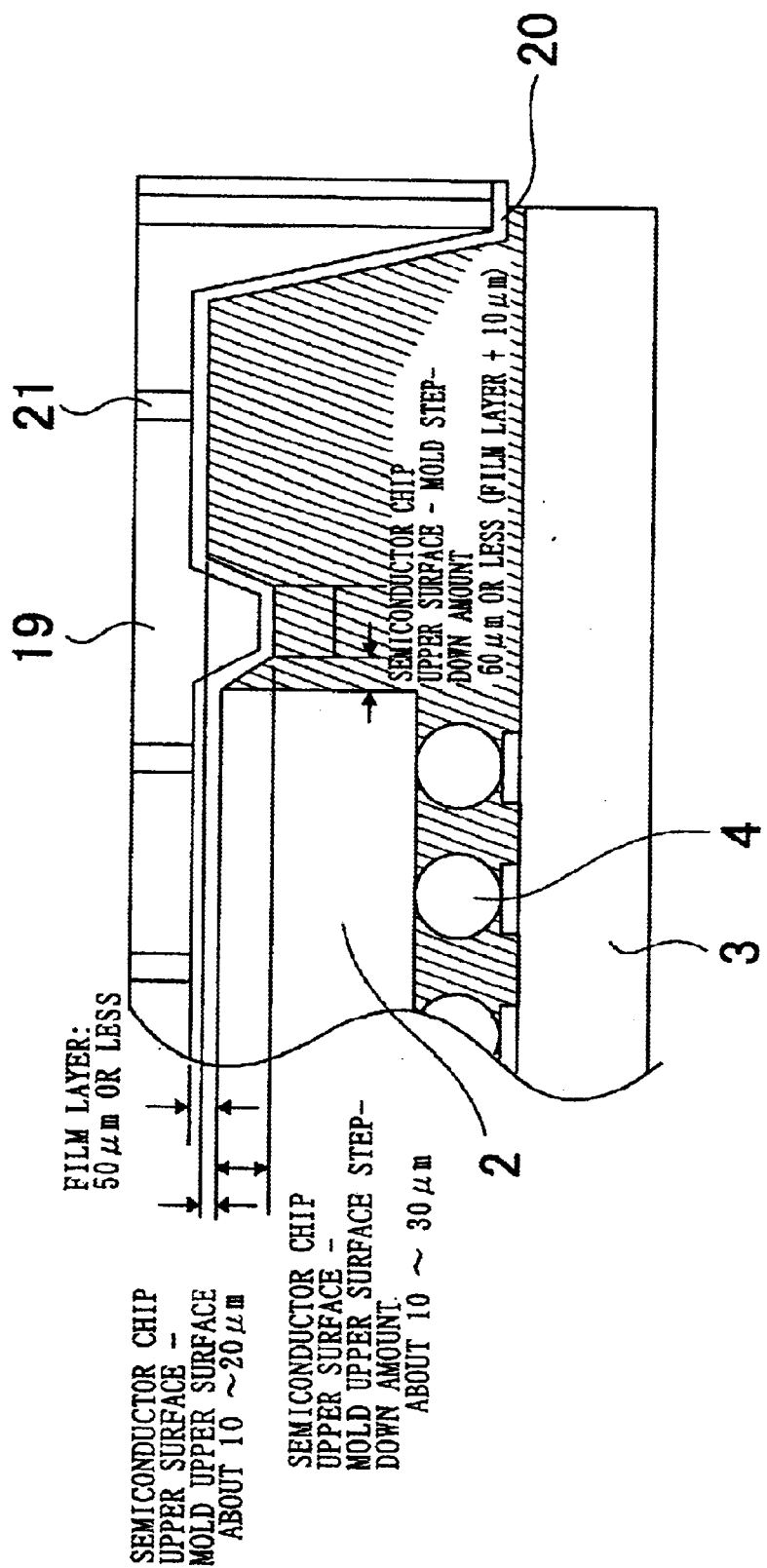
FIG. 6 is a partial enlarged view of FIG. 5.

FIG. 6 is partial enlarged view of FIG. 5. In the lower die 13c, a plurality of suction holes 21 are provided. Along the inner periphery of the lower die 13c, a chip protection sheet 20 formed from a film of about 50 μm thick and having high elastic modulus is fitted. Then, deaeration is performed externally to tightly fit the chip protection sheet 20 on the cavity portion 19. On the other hand, the semiconductor chip 2 and the interposer substrate 3 integrated by flip chip connection are set directing the through hole 10 toward the intermediate die 13b. Subsequently, the upper die 13a, the intermediate die 13b and the lower die 13c are combined to firmly fix respective parts by a not shown clamping means. At this time, the position of the through hole 10 corresponds to the position corresponding to the resin injection conduit 17. In FIG. 4, the interposer substrate is illustrated as being transparent for making the solder bumps 4 of the semiconductor chip 2 visible. Thus, a relationship in position between the through hole 10 and the semiconductor chip 2 is clearly shown.

When the plunger 14 is inserted into the plunger insertion opening 18 to feed biphenyl resin from the plunger 14 under pressure. Then, biphenyl resin is filled into the cavity portion 19 via the resin injection conduit 17 and the through hole 10 to fill the through hole 10, the under-fill region and mold resin portion. Subsequently, by curing biphenyl resin by holding the mold 13 in a given period, the semiconductor chip 2, the interposer substrate 3 and the molded resin 11 are integrally molded.

As shown in FIG. 6, a height difference between the back surface of the semiconductor chip 2 and the upper surface of the molded resin 11 was set within a range from 10 to 20 μm, a height difference between the back surface of the semiconductor chip 2 and the bottom surface portion of the stepped down portion 12 was set within a range from 10 to 30 μm, a distance from the side surface of the semiconductor chip 2 and the ends portion of the bottom surface of the stepped down portion 12 is less than or equal to 60 μm, and the width of the bottom surface of the stepped down portion 12 is greater than or equal to 1 mm.

Since a structure for forming the stepped down portion 12 is provided in the cavity portion 19, tightness of fitting of the chip protection sheet 20 and the semiconductor chip 2 at the corner portion on the back surface of the semiconductor chip 2 is increased to prevent penetration of the resin into the back surface of the semiconductor chip 2 upon injecting the molten resin under pressure for forming the molded resin 11. When a distance between the stepped down portion 12 and the side surface of the semiconductor chip 2 is small, since the flow passage is narrower than other portion in the package, flow amount of the molten resin for forming the molded resin 11 toward the back surface of the semiconductor chip 2 is decreased to further enhance penetration prevention effect to the back surface of the semiconductor chip 2.

Figure 14:
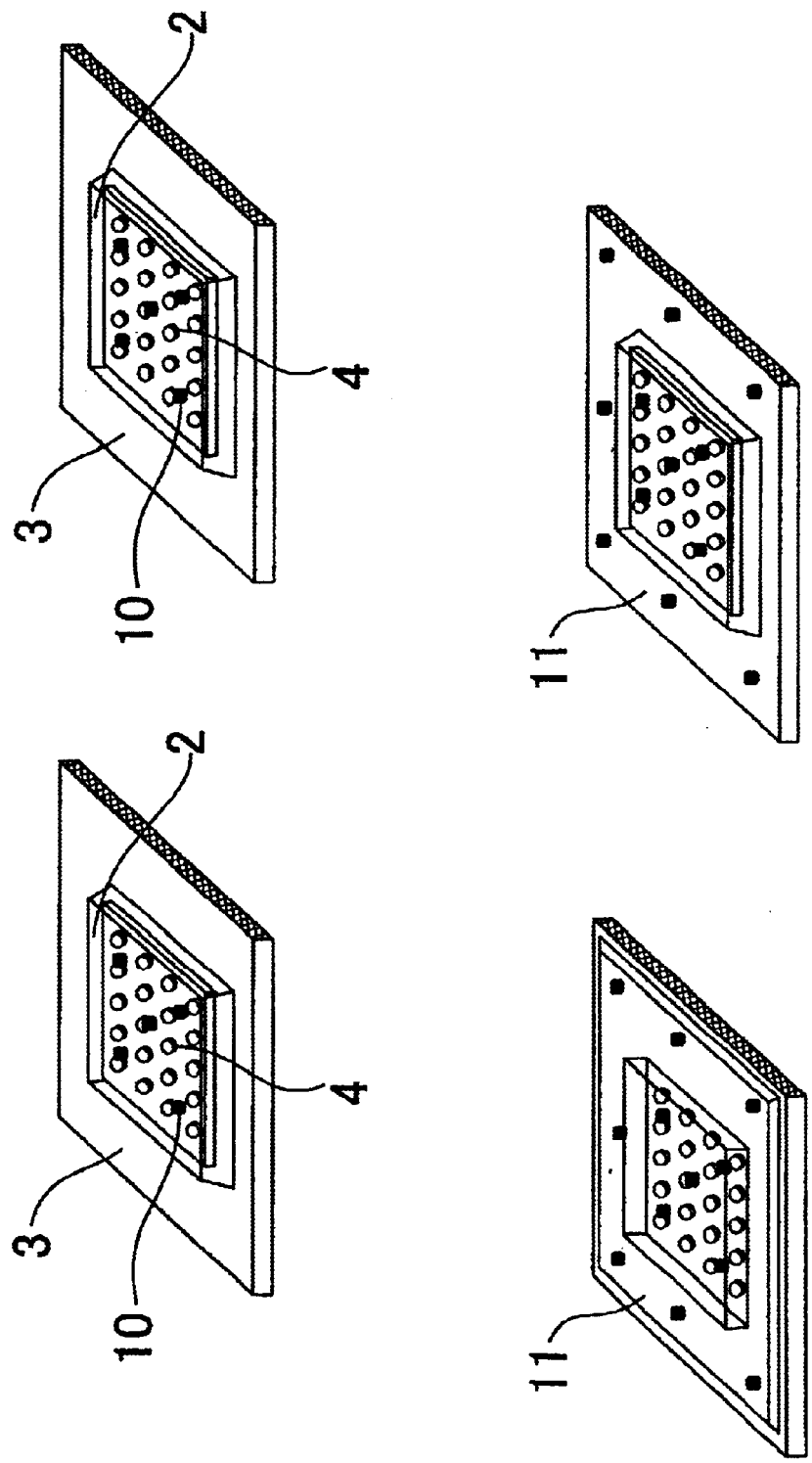
FIG. 14 is an example of a semiconductor package after formation of molded resin.
Figure 15:
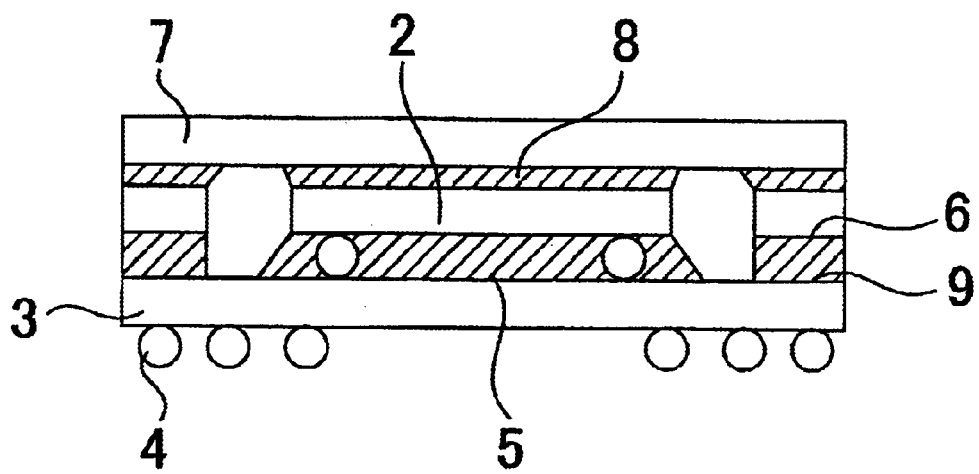
FIG. 15 is a diagrammatic illustration showing an internal structure of the conventional semiconductor package.

An example of the semiconductor package after formation of the molded resin 11 is shown in FIG. 14. On the side periphery portion of the semiconductor chip 2, the molded resin portion is formed by the molded resin 11. Depending on the shape of the mold 13, there is a case to form the molded resin portion only in the periphery of the semiconductor chip 2 and a case to form over the entire region of the interposer substrate 3. On the other hand, in some desired characteristics of the semiconductor package, the molded resin 11 may be formed with covering the upper surface portion of the semiconductor chip 2.

By forming the molded resin 11 over substantially entire region of the interposer substrate 3, strength of the overall semiconductor package can be enhanced to reduce bowing of the semiconductor package upon heating process. Therefore, reliability in mounting of the semiconductor package can be improved.

Second Embodiment

As the second embodiment of the present invention, concerning the semiconductor package of the shape not providing the stepped down portion 12, only portions different from the first embodiment will be discussed.

Figure 7:
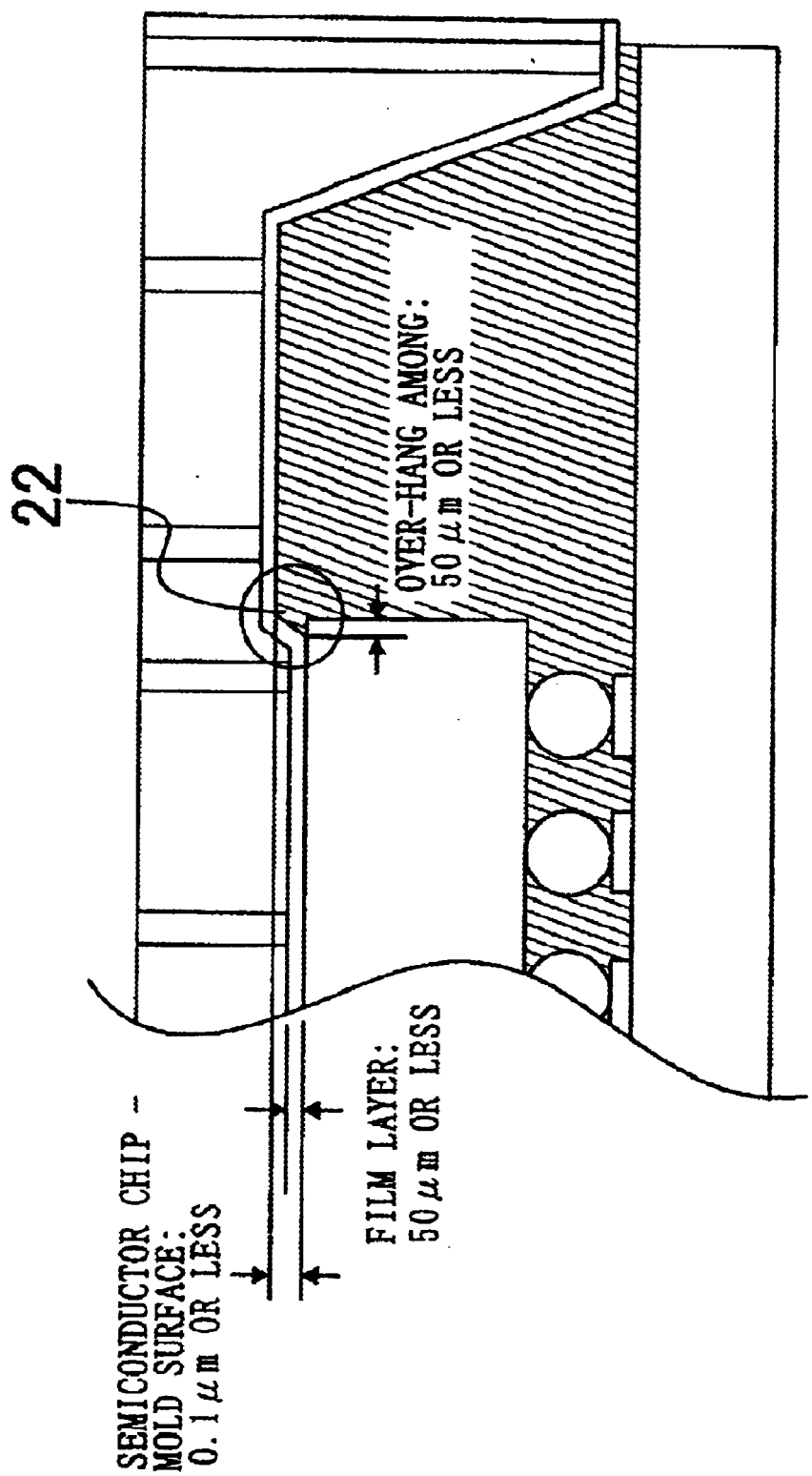
FIG. 7 is a sectional side elevation of the mold in the second embodiment of the present invention.

FIG. 7 is a sectional side elevation of the mold in a condition where the semiconductor package is set and the mold is clamped. In FIG. 7, a shape of the molded resin 11 in the vicinity of the junction of the semiconductor chip 2, the heat spreader 7 and the molded resin 11 is illustrated diagrammatically.

In portion around the upper surface of the semiconductor chip 2, an over-hang portion 22, in which the molded resin 11 overlaps over the semiconductor chip 2, is formed. On the other hand, the upper surface portion of the molded resin 11 is formed at a position higher than the back surface of the semiconductor chip 2. At this time, a difference in the height direction between the back surface of the semiconductor chip 2 and the upper surface of the molded resin 11 is less than or equal to 0.1 mm. The over-hanging amount as overlapping amount over the semiconductor chip 2 in the over-hanging portion 22 is set to be less than or equal to 50 $\mu$m.

By forming the over-hang portion 22 on the peripheral portion of the back surface of the semiconductor chip 2, the corner portion of the semiconductor chip 2 is protected by the molded resin 11 to reduce damage of the semiconductor chip 2.

By forming the upper surface of the molded resin 11 at higher position than the back surface of the semiconductor chip 2, contact of the top plate form metallic heat spreader 7 and the semiconductor chip 2 is prevented to prevent damage of the semiconductor chip 2 by contacting between the semiconductor chip 2 and the heat spreader 7. On the other hand, since it is unnecessary to form the stiffener as required in the prior art, simplification of parts construction and simplification of the fabrication process can be achieved to shorten fabrication period and reduction of fabrication cost.

By providing the structure for forming the over-hang portion 22 in the cavity portion 19, damaging of the corner portion of the back surface of the semiconductor chip 2 by contact between the corner portion of the back surface of the semiconductor chip 2 and the cavity portion 19, can be successfully prevented. Also, tightness of fitting the chip protection sheet 20 on the semiconductor chip 2 is enhanced to successfully prevent the molten resin from penetrating to the back surface of the semiconductor chip 2.

Third Embodiment

As the third embodiment of the present invention, another embodiment of the upper die 13a, the gate plate 16 and the through opening 10 will be discussed only for the portions different from those in the first embodiment with reference to the drawings.

Figure 8A:
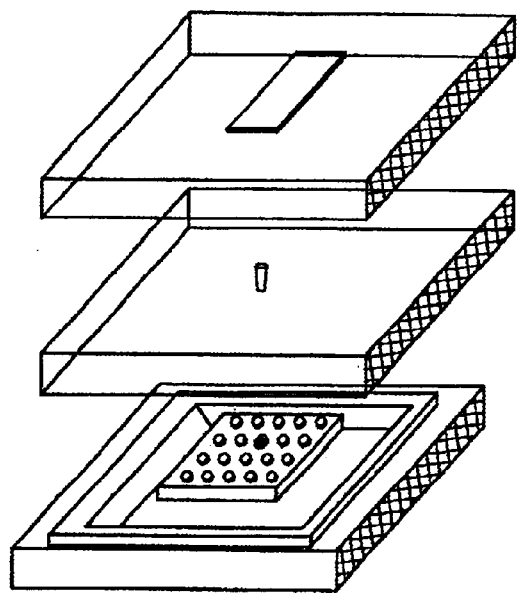
FIGS. 8A and 8B are illustrations briefly showing a combination of an upper die, a gate plate and a lower die.

FIG. 8A briefly shows a combination of the upper die 13a, the gate plate 16 and the lower die 13c. In order to make a relationship in position of the runner 15, a resin injection conduit 17, the through opening 10 and the semiconductor chip 2 clear, the interposer substrate 3 is illustrate as being transparent.

Figure 8B:
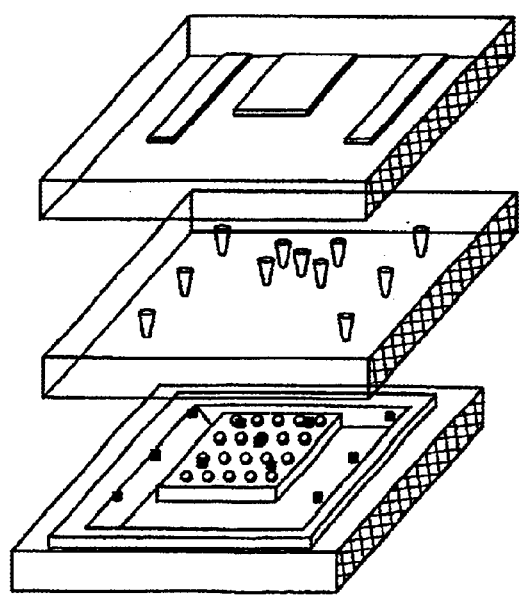

FIG. 8B is an embodiment where a plurality of through holes 10 are formed. The through openings 10 are formed even positions outside of the region corresponding to the semiconductor chip 2 of the interposer 3. As the gate plate 16 in which the resin injection hole 17 is provided at the position corresponding to the through hole 10. On the other hand, as the upper die 13a, the runner 15 is formed so that the molten resin 11 can be supplied to the position corresponding to the resin injection conduit 17.

Figure 9:
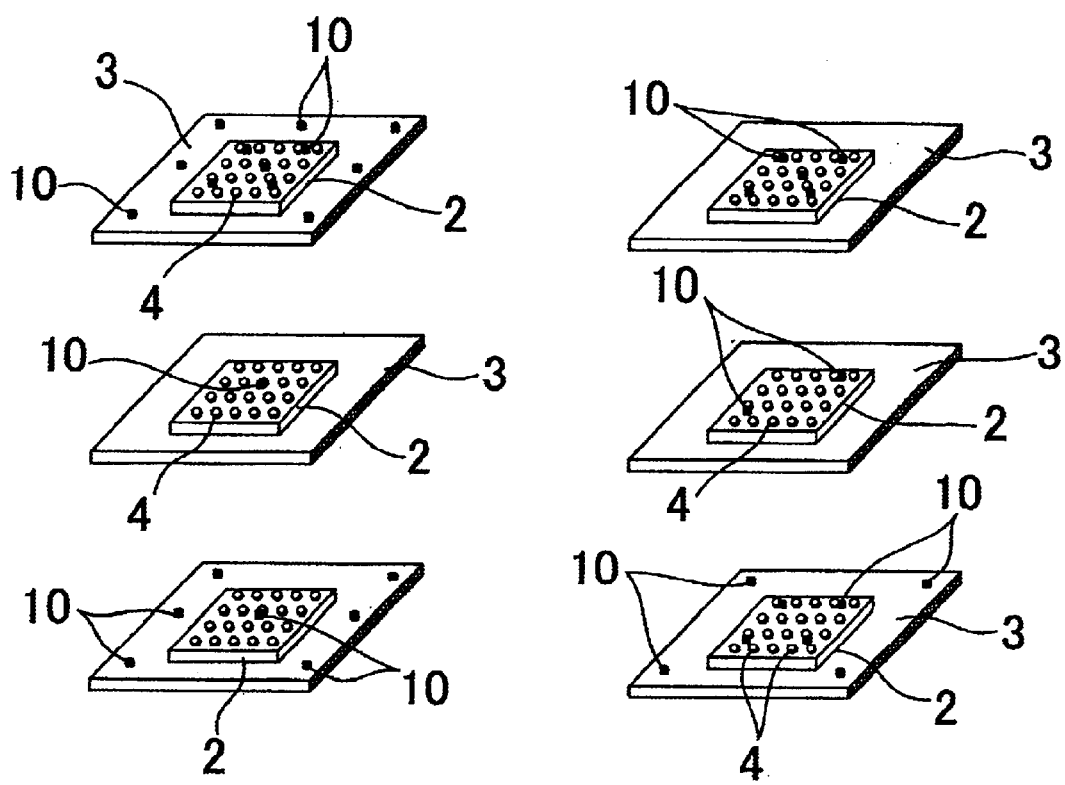
FIG. 9 is an illustration as viewing a position of the through hole as viewed from an interposer substrate side.

FIG. 9 shows an example showing a position of the through openings 10 in the interposer substrate 3 and illustrates the condition where the semiconductor chip 2 and the interposer substrate 3 are connected by flip chip connection, as viewed from the interposer substrate side. In order to make a relationship in position between the through hole 10 and semiconductor chip clear, the interposer substrate 2 is illustrated as being transparent. As shown in FIG. 8B, the gate plate 16 in which the resin injection hole 17 is provided at the position corresponding to the through hole 10. On the other hand, as the upper die 13a, the runner 15 is formed so that the molten resin 11 can be supplied to the position corresponding to the resin injection conduit 17.

Since the molten resin for forming the molded resin 111 can be injected through a plurality of through holes 10, a period required for filing the molten resin can be shortened to increase production amount per unit period to lower production cost. On the other hand, by adjusting positions and number of the through openings provided at portions corresponding to the semiconductor chip 2, transfer seal can be performed depending upon the shape of the cavity portion 19.

Fourth Embodiment

As the fourth embodiment of the present invention, the embodiment of the case where the molten resin for forming the molded resin 11 is filled through a plurality of through openings, will be discussed with reference to the drawings.

Figure 10:
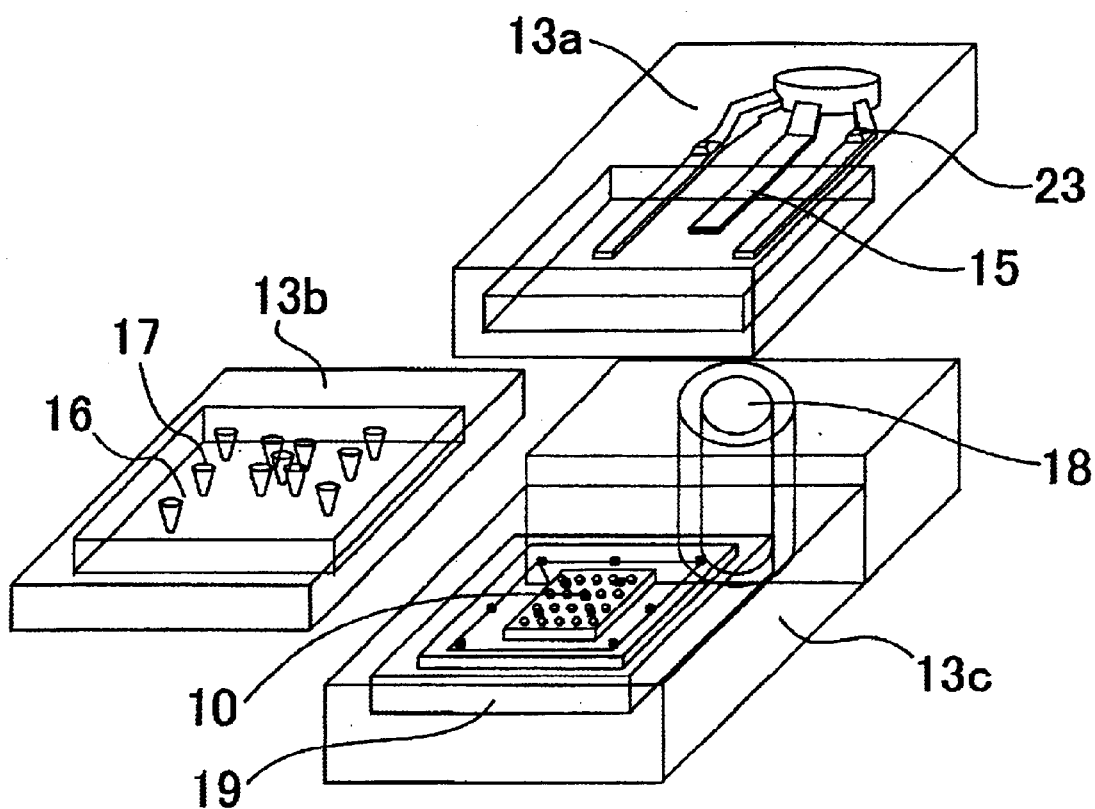
FIG. 10 is an illustration showing the fourth embodiment of a sealing mold.

FIG. 10 is a diagrammatic illustration showing the embodiment of the sealing mold in the case where the mold 13 is consisted of the upper die 13a, the intermediate die 13b and the lower die 13c.

In the upper die 13a, a plurality of runners 15 as flow passage to flow the molten biphenyl resin are formed for supplying the molten biphenyl resin injected by the plunger 14 under pressure to the surface contacting with the intermediate die 13b. Some of the runners 15 are formed with time difference adjusting portions 23 as space wider than other portion.

In the intermediate die 13b, the gate plate 16 is provided detachably. In the gate plate 16, at positions corresponding to the runners 15, the resin injection conduits 17 are formed for injecting the molten biphenyl resin to the lower die 13c.

In the lower die 13c, the plunger introducing opening 18 for inserting the plunger 14 for injecting the molten biphenyl resin into the runners 15 of the upper die 13a, and the cavity portion 19 for forming the molded resin 11 into a desired shape, are formed.

When the plunger 14 is inserted into the plunger introducing opening 18 and biphenyl resin is injected from the plunger 14, biphenyl resin is filled in the cavity portion 19 via the runners 15, the resin injection conduits 17 and the through openings 10. At this time, in the runners 15 provided with the time difference adjusting portions 23, biphenyl resin flows into the resin injection conduits 17 after filling the time different adjusting portion to provide a time difference in filling through the through openings 10 in comparison with the filling timing of biphenyl resin flowing into the resin injection conduit 17 from the runner 15 not formed in the time difference adjusting portion 23.

Subsequently, by curing biphenyl resin by cooling the entire mold, the semiconductor chip 2, the interposer substrate 3 and the molded resin 11 are formed integrally.

In the embodiment shown in FIG. 10, among three runners 15, the runner 15 located at center is not provided with the time difference adjusting portion 23, whereas other two runners 15 are provided with the time difference adjusting portions 23, biphenyl resin is filled on the side surface of the semiconductor chip after filling biphenyl resin into the gap between the semiconductor chip 2 and the interposer substrate 3. Thus, by preferentially filling biphenyl to the under-fill region as the gap between the semiconductor chip 2 and the interposer substrate 3, formation of the internal void can be restricted to improve yield in fabrication.

On the other hand, while not illustrated in FIG. 10, by varying width of the resin flow passage of the runner 15, time difference can be provided in filling biphenyl resin similar to the time difference adjusting portion 23. In this case, since amounts of biphenyl resin to be filled from the through openings per unit period are different, speed of filling of the resin can be set to be different per respective through openings. By filling the resin depending upon the shape of the semiconductor package, occurrence of the internal void can be restricted to improve yield in fabrication.

Fifth Embodiment

As the fifth embodiment of the present invention, an embodiment for transfer sealing a plurality of semiconductor packages will be discussed with reference to the drawings.

Figure 11A:
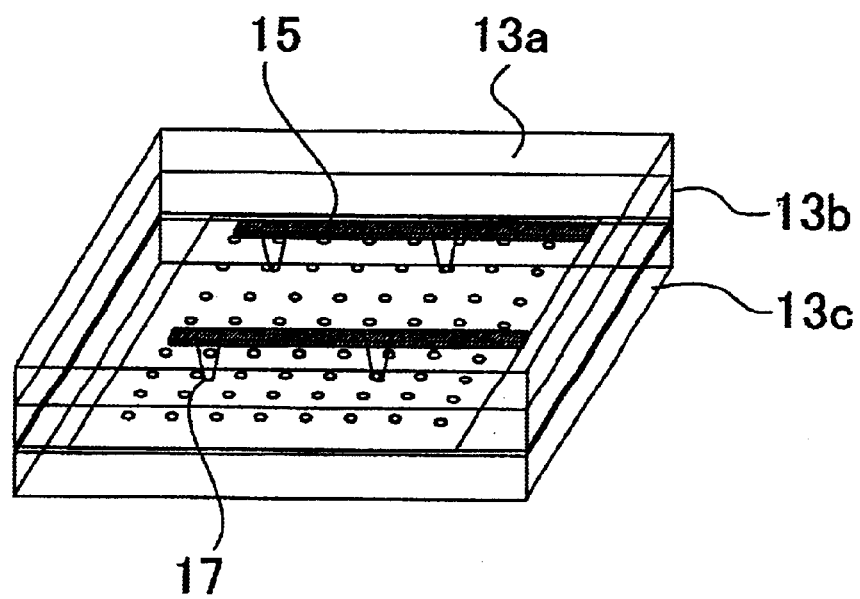
FIGS. 11A and 11B are illustrations showing an embodiment, in which a plurality of semiconductor packages are sealed simultaneously by transfer seal.

FIG. 11A is an illustration showing a condition where the upper die 13a, the intermediate die 13b and the lower die 13c are combined in transparent manner. In the upper die 13a, a plurality of runners 15 are formed and a plurality of resin injection conduits 17 are formed in the gate plate 16. In the lower die 13c, a plurality of semiconductor chip 2 and the interposer substrate 3 are set.

Figure 11B:
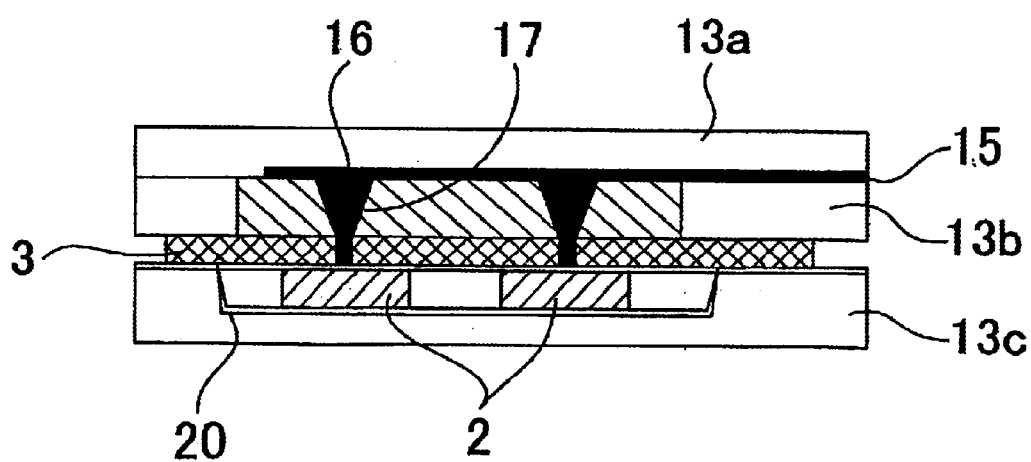

FIG. 11B is a sectional side elevation of FIG. 11A, in which a plurality of semiconductor chips 2 are transfer sealed by one mold 13.

Figure 12:
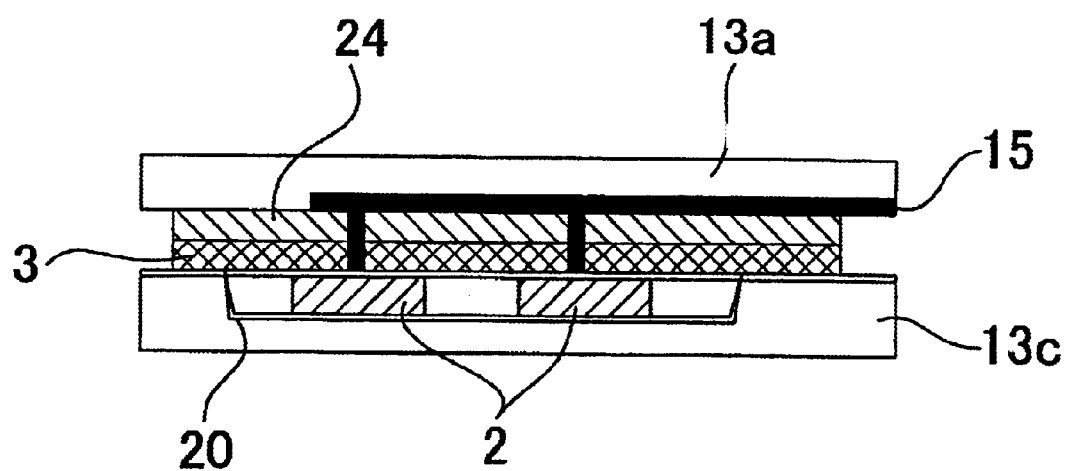
FIG. 12 is an illustration showing a case where a substrate protection sheet is employed in place of a gate plate.

On the other hand, discussion will be given for the case where a substrate protection sheet 24 is used in place of the intermediate die 13b and the gate plate 16 in transfer seal, with reference to FIG. 12. By inserting the substrate protection sheet 24 provided with the resin injection conduit 17 between the upper die 13a and the interposer substrate 3, damage of the interposer substrate 3 by contact between the upper die 13a and the interposer substrate 3 can be prevented.

Since a plurality of semiconductor packages can be transfer sealed simultaneously by one set of mold, it becomes possible to easily increase production amount per unit period and to reduce production cost.

Sixth Embodiment

As the sixth embodiment, discussion will be given for injection of biphenyl in the case where the through opening 10 only for filling the resin in the interposer substrate 3 is not provided, with reference to the drawing.

Figure 13:
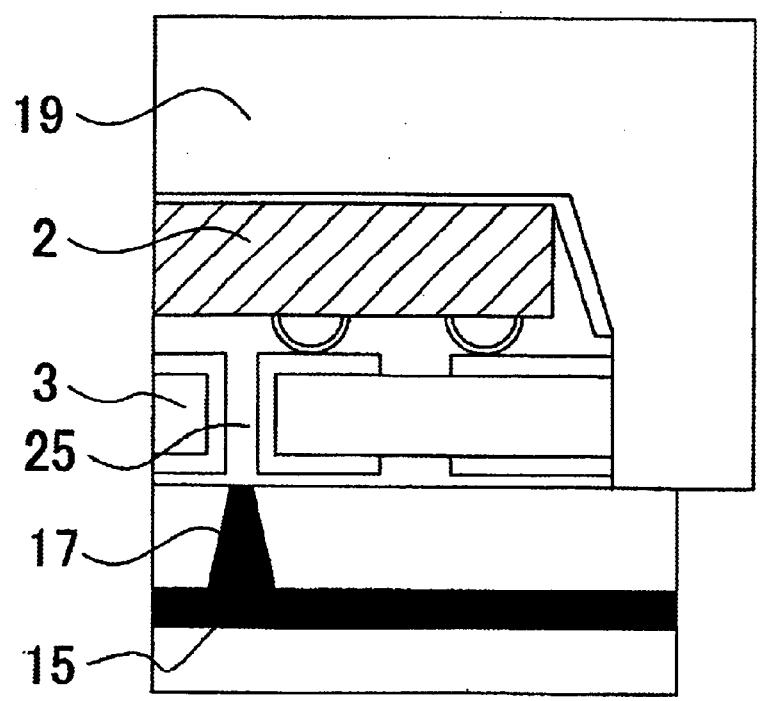
FIG. 13 is a sectional side elevation of the sixth embodiment of the mold.

FIG. 13 is a sectional side elevation of the mold and package in the condition where the package is set and the mold is clamped upon injecting biphenyl resin using a through hole 25.

Normally, the interposer substrate 3 is formed with through hole 25 for electrically connecting both surfaces of the interposer substrate 3. In case that the interposer substrate 3 has multi-layer structure, the through hole establishes electrical connection of the surface and back surface with complicate diffraction. However, here, it is assumed that the through hole 25 is formed to extend both surfaces of the interposer substrate 3 in straight. In this case, both surfaces of the interposer substrate 3 are electrically connected and, in conjunction therewith, biphenyl resin can be injected through the through hole 25.

As shown in FIG. 13, the gate plate 16 formed with the resin injection conduits 17 at positions corresponding to the through holes 25 is prepared and injecting the biphenyl resin through the through holes 25, transfer seal can be performed without forming the through openings 10 in the interposer substrate 3. Since the through openings 10 are not required to be formed in the interposer substrate 3, area of the interposer substrate 3 can be made small to contribute for down-sizing of the semiconductor package.

Since the surface of the semiconductor chip is formed at lower position than the resin surface of the molded resin, it can successfully present contact between the heat spreader and the semiconductor chip which otherwise damage the semiconductor chip in the subsequent process. Also, since it becomes unnecessary to form stiffener, fabrication process and component parts can be simplified as compared with the prior art to permit lowering of production cost.

By forming the stepped down portion in the molded resin portion, extra amount of metal paste and/or bonding agent to be used for securing the heat spreader on the semiconductor chip and/or the molded resin portion, can be captured to prevent occurrence of bonding failure.

By forming the over-hang portion, the corner portions of the semiconductor chip can be protected by the resin to successfully prevent breakage of the semiconductor chip.

By forming the molded resin over substantially entire area, bowing of the semiconductor package in heat treatment in the subsequent process to improve reliability in mounting of the semiconductor package.

By using the through hole, it becomes unnecessary to form the through opening in the printed circuit board to contribute for down-sizing of the printed circuit board to contribute for reduction of weight and size of the semiconductor package.

By making the resin flow passage provided in the mold corresponding to the semiconductor package, it becomes possible to fabricate variety of semiconductor packages with only exchanging the mold to simplify fabrication process. ON the other hand, in order to fill the resin from the through opening, it is possible to set the process for preferentially filling the resin of the under-fill region.

By varying the injection amount of the resin according to elapsed time, filing of the resin into particular portion of the semiconductor package can be assured. Resin sealing corresponding various kind of semiconductor packages can be performed.

By filing the resin from a plurality of positions, a period required for filing can be shortened by reducing production cost.

Since resin filling speed to the under-fill region can be higher than that of the mold resin portion, filing of resin into the under-fill region can be done at early timing in comparison with filling in the mold resin portion for ensuring filing of the resin within the under-fill area to suppress formation of the internal void to improve reliability of the semiconductor package.

Also, by filling the resin in a lump, number of semiconductor package to be fabricated within the unit period can be increased to contribute for lowering of production cost.

Since volumes of respective resin passages are different, filling start timing and filling speed can be varied at respective route of the resin passages to permit resin seal or encapsulation depending upon the shape of the semiconductor passage and thus to adapt for increased variety of the products.

In case of the mold exchangeable of the resin injection conduit and the runner, it is facilitated to exchange the resin flow passage to permit resin seal or encapsulation depending upon the shape of the semiconductor passage and thus to adapt for increased variety of the products.

Furthermore, by providing the stepped down portion, penetration of the resin to the back surface of the semiconductor chip can be prevented to contribute for improvement of yield in production.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments, which can be embodied within a scope encompassed and equivalent thereof with respect to the feature set out in the appended claims.

What is claimed is:

1. A semiconductor device, in which a semiconductor chip is connected to a wired substrate, comprising:
    a through opening provided at a predetermined position of said wired substrate;
    an under-fill region as a gap portion between said wired substrate and said semiconductor chip; and
    a molded resin portion as peripheral portion along side edge of said semiconductor chip;
    said molded resin portion and said through opening being sealed by resin;
    a region where a distance between a connection surface with said semiconductor chip of said wired substrate and a resin surface of said molded resin portion is greater than a distance between said connection surface with said semiconductor chip of said wired electrode and a back surface of said semiconductor chip, being formed in said molded resin portion.

2. A semiconductor device, in which a semiconductor chip is connected to a wired substrate, comprising:
    a through opening provided at a predetermined position of said wired substrate;
    an under-fill region as a gap portion between said wired substrate and said semiconductor chip; and
    a molded resin portion as peripheral portion along side edge of said semiconductor chip;
    said molded resin portion and said through opening being sealed by resin;
    a stepped down portion as a recessed portion being formed surrounding said semiconductor chip in said molded resin portion as peripheral portion of said semiconductor chip.

3. A semiconductor device as set forth in claim 2, wherein said stepped down portion of said molded resin portion has a tilted surface descending from an upper end surface of said semiconductor chip.

4. A semiconductor device as set forth in claim 1, wherein said molded resin portion is formed with an over-hang portion overlapping with the upper end surface of said semiconductor device.

5. A semiconductor device as set forth in claim 1, wherein said molded resin portion is formed over substantially entire area of said wired substrate.

6. A semiconductor device as set forth in claim 1, wherein said resin is injected through one or more through holes provided in said wired substrate for electrical connection under pressure for forming said under-fill region and said molded resin portion.

* * * * *